(12) United States Patent
Feng et al.

(10) Patent No.: US 9,989,580 B2
(45) Date of Patent: Jun. 5, 2018

(54) FAULT ANALYSIS IN ELECTRIC NETWORKS HAVING A PLURALITY OF MULTI-PHASE BUSES

(71) Applicant: ABB Research Ltd., Zurich (CH)

(72) Inventors: Xiaoming Feng, Cary, NC (US);
Christian Krueppel, Cologne (DE);
William Peterson, Fulshear, TX (US)

(73) Assignee: ABB Research Ltd., Zurich (CH)

( * ) Notice: Subject to any disclaimer, the term of this patent is extended or adjusted under 35 U.S.C. 154(b) by 1060 days.

(21) Appl. No.: 13/946,644

(22) Filed: Jul. 19, 2013

(65) Prior Publication Data

US 2014/0052391 A1    Feb. 20, 2014

Related U.S. Application Data

(60) Provisional application No. 61/682,857, filed on Aug. 14, 2012.

(51) Int. Cl.
*G01R 31/08* (2006.01)
*G01R 21/06* (2006.01)
(Continued)

(52) U.S. Cl.
CPC ........... *G01R 31/088* (2013.01); *G01R 21/06* (2013.01); *G01R 31/086* (2013.01); *G06F 17/5036* (2013.01); *H02J 2003/007* (2013.01)

(58) Field of Classification Search
USPC ......................................................... 702/58
See application file for complete search history.

(56) References Cited

U.S. PATENT DOCUMENTS 4,589,073 A    5/1986    Kidd
5,359,711 A    10/1994   Hartmann et al.
(Continued)

OTHER PUBLICATIONS

Kocar, Ilhan et al., "General and Simplified Computation of Fault Flow and Contribution of Distributed Sources in Unbalanced Distribution Networks", 2012 IEEE Power and Energy Society General Meeting, San Diego, California, USA, Jul. 2012, pp. 1-8.
(Continued)

*Primary Examiner* — Paul D Lee
(74) *Attorney, Agent, or Firm* — Taft Stettinius & Hollister LLP

(57) ABSTRACT

Fault analysis for an electric network having a plurality of multi-phase buses is performed by computing equivalent circuits for the multi-phase buses of interest. Each equivalent circuit includes an N×N impedance matrix, N corresponding to the number of phases of the multi-phase bus for which that equivalent circuit is computed. Elements of the impedance matrices are determined based on voltages resulting from a plurality of experimental current injection vectors and a factorized pre-fault admittance matrix. The pre-fault admittance matrix represents nodal admittance of the multi-phase buses without faults. A fault current injection vector for each multi-phase bus and fault type of interest is determined based on the equivalent circuit determined for that multi-phase bus. A fault voltage vector for each multi-phase bus and fault type of interest is determined based on the factorized pre-fault admittance matrix and the fault current injection vector determined for that multi-phase bus and fault type.

20 Claims, 7 Drawing Sheets

(51) Int. Cl.
H02J 3/00 (2006.01)
G06F 17/50 (2006.01)

(56) References Cited

U.S. PATENT DOCUMENTS

| | | | |
|---|---|---|---|
| 7,746,080 B2 | 6/2010 | Jones | |
| 2012/0182038 A1* | 7/2012 | Marzetta | G01R 31/086 324/764.01 |
| 2012/0283967 A1* | 11/2012 | Duan | H02J 13/0006 702/60 |
| 2013/0226482 A1* | 8/2013 | Sun | H02J 3/26 702/60 |
| 2013/0346011 A1* | 12/2013 | Ou | H02J 3/06 702/123 |
| 2014/0343881 A1* | 11/2014 | Johannsson | H02J 3/18 702/65 |

OTHER PUBLICATIONS

Lin, W.-M. et al., "Unbalanced distribution network fault analysis with hybrid compensation", IET Generation, Transmission & Distribution, vol. 5, No. 1, Jan. 2011, pp. 92-100.

Wang, Anning et al., "A New Algorithm for Faults on Double-Circuit Lines in Phase Coordinates", Power & Energy Society General Meeting, PES '09, IEEE, Piscataway, NJ, USA, Jul. 2009, pp. 1-6.

Xu, Gang et al., "Equivalent Substitution Method-based Failures Analysis for Electromagnetic Loop", 2012 11th International Conference on Environment and Electrical Engineering (EEEIC), IEEE, May 2012, pp. 317-322.

Abdel-Akher, M., et al., "Fault Analysis of Multiphase Distribution Systems Using Symmetrical Components." IEEE Transactions on Power Delivery, Oct. 2010, pp. 2931-2939, vol. 25, No. 4, IEEE Power & Energy Society.

Alsac, O., et al. "Sparsity-Oriented Compensation Methods for Modified Network Solutions", IEEE Transactions on Power Apparatus and Systems, May 1983, pp. 1050-1060, vol. PAS-102, No. 5.

Berman, A., et al., "Analysis of Faulted Power Systems by Phase Coordinates", IEEE Transactions on Power Delivery, Apr. 1998, pp. 587-595, vol. 13, No. 2, IEEE Power & Energy Society.

Brandwajn, V., et al., "Generalized Method of Fault Analysis." IEEE Transaction on Power Apparatus and Systems, Jun. 1985, pp. 1301-1306, vol. PAS-104, No. 6.

Dilek, M., et al., "Calculating Short-Circuit Currents in Distribution Systems via Numerically Computed Thevenin Equivalents." IEEE PES Transmission and Distribution Conference and Exposition, Sep. 7-12, 2003, pp. 984-990, vol. 3.

Gajbhiye, R.K., et al., "Analysis of Faulted Power Systems in Three Phase Coordinates—A Generic Approach." 7th International Power Engineering Conference, Nov. 29, 2005-Dec. 2, 2005, pp. 1-6, vol. 2, Singapore.

Garcia, P. A. N., et al., "Fault Analysis using Continuation Power Flow and Phase Coordinates." IEEE Power Engineering Society General Meeting, Jun. 6-10, 2004, pp. 1-3, vol. 1.

Gross, G., et al., "A Two-Step Compensation Method for Solving Short-Circuit Problems", IEEE Transactions on Power Apparatus and Systems, Jun. 1982, pp. 1322-1331, vol. PAS-101, No. 6.

Laughton, M. A., et al., "Analysis of Unbalanced Polyphase Networks by the Pethod of Phase Coordinates. Part 2: Fault Analysis", Proceedings of the Institution of Electrical Engineers, 1969, pp. 857-865.

Pasini, G. L., et al., "Inverse Matrix Modification Iemma and Thevenin Theorem for Compensated Network Solutions", IEE Proceedings—Generation, Transmission & Distribution. Sep. 1999, pp. 496-500, vol. 146, No. 5, Institution on Engineering and Technology.

Roy, L., et al., "Exact Calculation of Simultaneous Fault Involving Open Conductors and Line-to-Ground Short Circuits on Inherently Unbalanced Power Systems", IEEE Transactions on Power Apparatus and Systems, Aug. 1982, pp. 2738-2746, vol. PAS-101, No. 8.

Teo, C. Y., et al., "A Direct Approach to Short-Circuit Current Calculation without Using Symmetrical Components." International Journal of Electrical Power & Energy Systems, Jun. 1997, pp. 293-298, vol. 19, No. 5.

Tinney, W. F., "Compensation Methods for Network Solutions by Optimally Ordered Triangular Factorization", IEEE Transactions on Power Apparatus and Systems, Jan. 1972, pp. 123-127, vol. PAS-91, No. 1.

Zhu, J., "Analysis of Transmission System Faults in the Phase Domain", Master'sThesis, Texas A&M university, Aug. 2004, pp. 1-107.

* cited by examiner

FAULT ANALYSIS IN ELECTRIC NETWORKS HAVING A PLURALITY OF MULTI-PHASE BUSES

PRIORITY CLAIM

The instant application claims priority to U.S. Provisional Patent Application No. 61/682,857 filed 14 Aug. 2012, the content of said Provisional application incorporated herein by reference in its entirety.

TECHNICAL FIELD

The instant application relates to electric networks, and more particularly to fault analysis for electric networks.

BACKGROUND

A distribution management system (DMS) for an electric power distribution system identifies fault locations by pattern matching between measured fault current(s) and predicted fault currents using a system model of the distribution network and hypothesized fault location, types, and fault impedances. Conventional symmetrical component-based methods are not suitable for distribution systems that are unbalanced in both build and operation. Phase-based methods are needed for accurate analysis. However, the resulting system can be very large, even for average feeders, because of the large number of nodes resulting from explicit representation of individual phases. Impedance based methods are both memory-intensive and time-consuming. Admittance matrix-based methods are much more memory efficient, but time-consuming. Compensation-based and matrix inversion lemma-based methods purportedly reduce the computation burden associated with inverting the admittance matrix repeatedly. However, these conventional methods are computationally intensive for repeated fault analysis at many bus locations with various fault types and involve building and factorizing the admittance matrix, or even inverting the admittance matrix for each fault location and fault types. Also, traditional methods using symmetrical components can handle unbalanced fault, but not unbalanced network modeling.

SUMMARY

According to the exemplary embodiments described herein, repeated fault analysis can be performed in a very efficient process at many locations in an electric network, such as in an electric power transmission or distribution system, with only a single factorization of the pre-fault admittance matrix and without subsequent updating of the factorization. Both the system under study and the faults analyzed can be balanced or unbalanced. Sparse admittance modeling of the pre-fault system is employed to perform the fault analysis, which uses the same factorized pre-fault admittance matrix regardless of the number of fault types and locations being analyzed.

According to an embodiment of a method of fault analysis for an electric network having a plurality of multi-phase buses, the method comprises: computing equivalent circuits for the multi-phase buses of interest, each equivalent circuit including an N×N impedance matrix where N corresponds to the number of phases of the multi-phase bus for which that equivalent circuit is computed; determining elements of the impedance matrices based on voltages resulting from a plurality of experimental current injection vectors and a factorized pre-fault admittance matrix, the pre-fault admittance matrix representing nodal admittance of the multi-phase buses without faults; determining a fault current injection vector for each multi-phase bus and fault type of interest based on the equivalent circuit determined for that multi-phase bus; and determining a fault voltage vector for each multi-phase bus and fault type of interest based on the factorized pre-fault admittance matrix and the fault current injection vector determined for that multi-phase bus and fault type.

According to an embodiment of a non-transitory computer readable medium storing a computer program operable to perform fault analysis for an electric network having a plurality of multi-phase buses, the computer program comprises program instructions to compute equivalent circuits for the multi-phase buses of interest, each equivalent circuit including an N×N impedance matrix where N corresponds to the number of phases of the multi-phase bus for which that equivalent circuit is computed. The computer program further comprises program instructions to determine elements of the impedance matrices based on voltages resulting from a plurality of experimental current injection vectors and a factorized pre-fault admittance matrix, the pre-fault admittance matrix representing nodal admittance of the multi-phase buses without faults. The computer program also comprises program instructions to determine a fault current injection vector for each multi-phase bus and fault type of interest based on the equivalent circuit determined for that multi-phase bus, and program instructions to determine a fault voltage vector for each multi-phase bus and fault type of interest based on the factorized pre-fault admittance matrix and the fault current injection vector determined for that multi-phase bus and fault type.

According to an embodiment of a computer system in communication with an electric network having a plurality of multi-phase buses, the computer system comprises a processing circuit operable to compute equivalent circuits for the multi-phase buses of interest, each equivalent circuit including an N×N impedance matrix where N corresponds to the number of phases of the multi-phase bus for which that equivalent circuit is computed. The processing circuit is further operable to determine elements of the impedance matrices based on voltages resulting from a plurality of experimental current injection vectors and a factorized pre-fault admittance matrix, the pre-fault admittance matrix representing nodal admittance of the multi-phase buses without faults. The processing circuit is also operable to determine a fault current injection vector for each multi-phase bus and fault type of interest based on the equivalent circuit determined for that multi-phase bus, and to determine a fault voltage vector for each multi-phase bus and fault type of interest based on the factorized pre-fault admittance matrix and the fault current injection vector determined for that multi-phase bus and fault type.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

Figure 1:
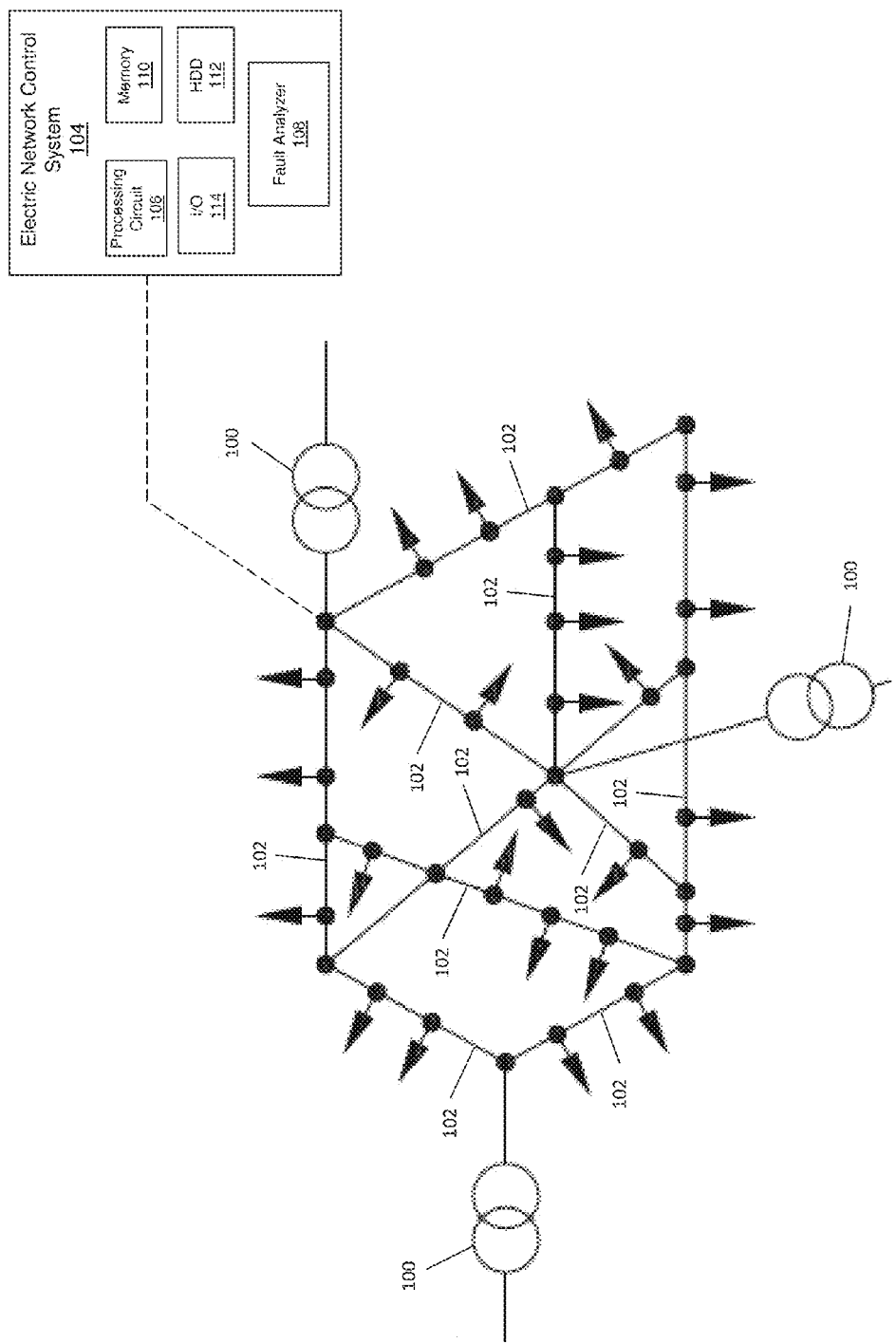
FIG. 1 illustrates a schematic diagram of an electric network including a plurality of multi-phase buses and a control system for implementing fault analysis for the network.

FIG. 1 illustrates a non-limiting exemplary embodiment of an electric network such as an electric power transmission or distribution system, which can have a meshed or radial architecture. The electric network has one or more substations 100 and a plurality of buses 102 connected to the substation(s) 100 for providing power. Some of the buses 102 are multi-phase i.e. three-phase or two-phase. Other ones of the buses 102 can be single-phase. Laterals, represented by lines with single-ended arrows in FIG. 1, can be connected to the buses 102 for distributing power to various service transformers (not shown for ease of illustration). Repeated fault analysis is performed at many locations in the electric network. Sparse admittance modeling of the pre-fault system is employed to perform the fault analysis, which uses the same factorized pre-fault admittance matrix regardless of the number of fault types and locations analyzed.

The fault analysis method described herein can be used as a supporting function for on-line fault location analysis and protection coordination analysis. Both the network and faults under analysis can be balanced or unbalanced. The method can also be applied to transmission systems where the systems are balanced among the phases except at the point of fault. Although the fault analysis process is described herein in terms of single location shunt faults (shunt faults of various types at a specified bus), the process can also be applied to simultaneous faults at multiple locations and series faults with straightforward extension.

The method described herein reduces the computational effort of the fault analysis at each location. The method performs minimal incremental operations using a factorized pre-fault admittance matrix, which is either already available from another application or calculated once and reused. Accordingly, the fault analysis performed at many different locations within the electric network is reduced to a repeated operation, once for each fault location, of a very streamlined procedure involving a very limited number of simple computations. The process can thus perform fault analysis at numerous system locations very efficiently. The process is similarly efficient for simultaneous faults at multiple locations.

In more detail, a control system 104 is provided for monitoring and controlling operation of the electric network, including fault analysis. The control system 104 can be connected to the electric network via a wired or wireless connection as indicated by the dashed line connection shown in FIG. 1, or included in one of the substations 100. The control system 104 includes a processing circuit 106 which can include digital and/or analog circuitry such as one or more controllers, processors, ASICs (application-specific integrated circuits), etc. for executing program code which performs network control functions such as fault analysis. To this end, the control system 104 includes a fault analyzer 108 included in or associated with the processing circuit 106 for performing the fault analysis procedures and corresponding calculations described herein. The control system 104 also has memory 110 such as DRAM (dynamic random access memory) and an HDD (hard disk drive) 112 for storing the program code and related data processed and accessed by the processing circuit 106 and fault analyzer 108 during execution of program code. The control system 104 also has I/O (input/output) circuitry 114 for sending and receiving information, including receiving voltage and current measurement information from the electric network which can be used in the fault analysis process to identify likely faults in the network.

Figure 2:
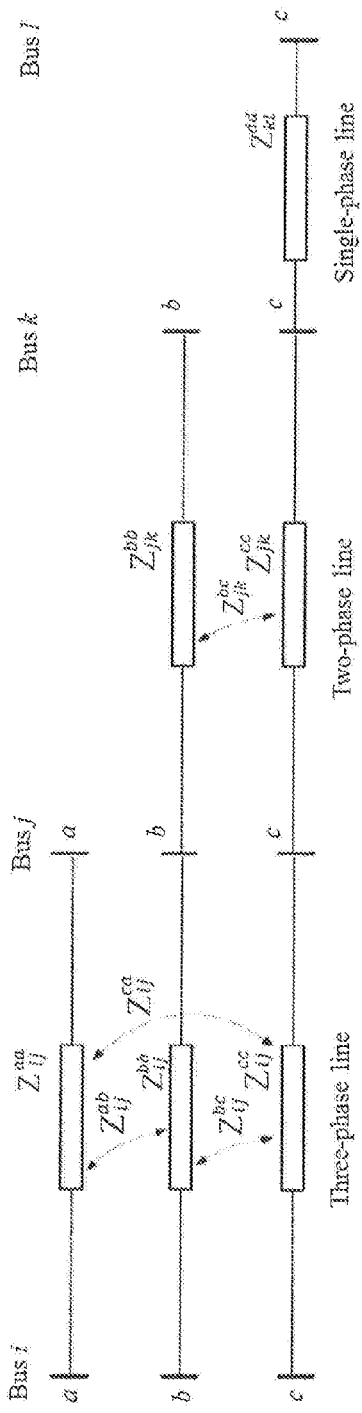
FIG. 2 illustrates a schematic diagram of various phase connections between different buses of the electric network.
Figure 3:
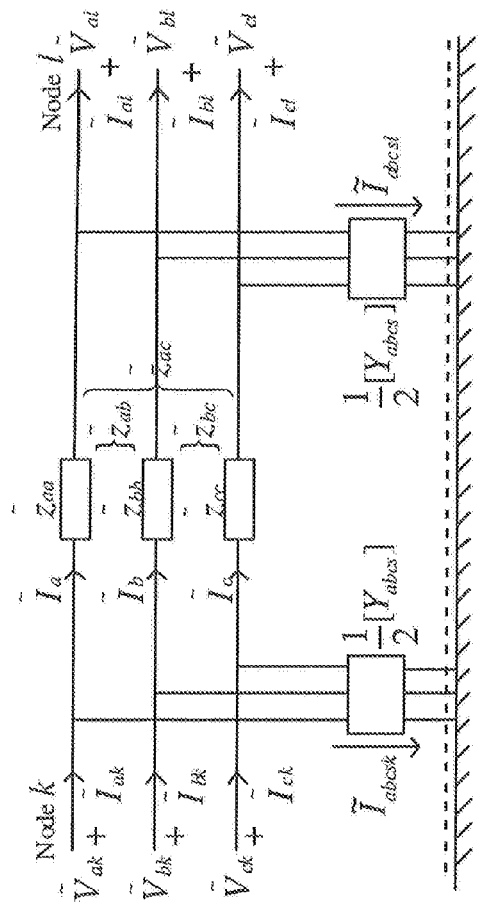
FIG. 3 illustrates a schematic diagram of a line model between nodes k and l of an exemplary three-phase bus of the electric network.

The fault analysis method implemented by the control system 104 can model individual phases of the buses 102, e.g., because of phase unbalance in system build, operation, or faults. FIG. 2 shows various phase connections (phase a, phase b, phase c) between different buses (Bus i, Bus j, Bus k, Bus l, etc.) of the electric network, and the corresponding self-impedance models for each individual line section ($Z_{ij}^{aa}, Z_{ij}^{bb}, Z_{ij}^{cc}$, etc.) and mutual coupling between phases of the same multi-phase line section ($Z_{ij}^{ab}, Z_{ij}^{bc}, Z_{ij}^{ca}$, etc.). FIG. 3 shows a corresponding line model between nodes k and l of an exemplary three-phase bus. Each phase has a voltage ($\tilde{V}_{ak}, \tilde{V}_{bk}, \tilde{V}_{ck}$) and current ($\tilde{I}_{ak}, \tilde{I}_{bk}, \tilde{I}_{ck}$) at node k, and a voltage ($\tilde{V}_{al}, \tilde{V}_{bl}, \tilde{V}_{cl}$) and current ($\tilde{I}_{al}, \tilde{I}_{bl}, \tilde{I}_{cl}$) at node l. Line impedances can be modeled between nodes k and l of the bus as $\tilde{Z}_{aa}, \tilde{Z}_{bb}$ and $\tilde{Z}_{cc}$ with corresponding phase currents $\tilde{I}_a$, $\tilde{I}_b$ and $\tilde{I}_c$. The mutual impedance between phases a and b is modeled as $\tilde{Z}_{ab}$, the mutual impedance between phases b and c is modeled as $\tilde{Z}_{bc}$ and the mutual impedance between phases a and c is modeled as $\tilde{Z}_{ac}$. An equivalent admittance (Y) and current $\tilde{I}_{abcsx}$ between the phases and ground can also be modeled for each node.

Figure 4B:
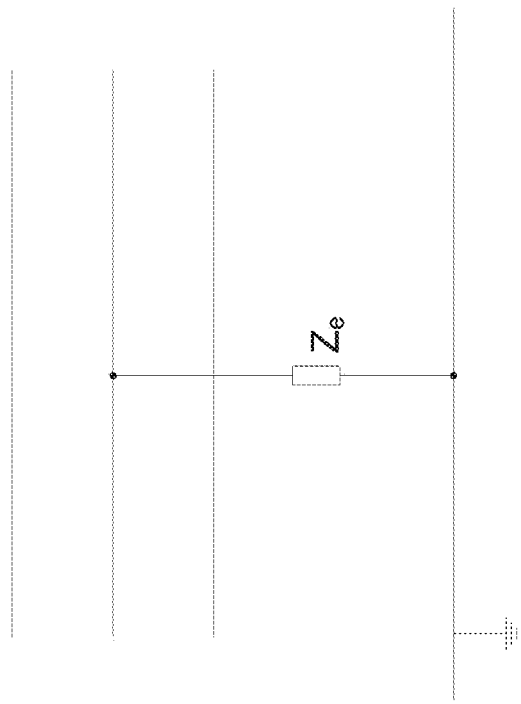
FIGS. 4A through 4D illustrate schematic diagrams of various fault types for the electric network.
Figure 4A:
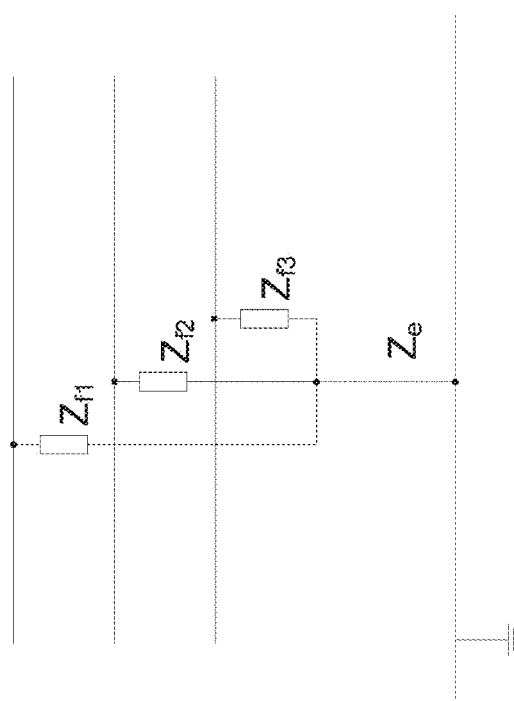
Figure 4D:
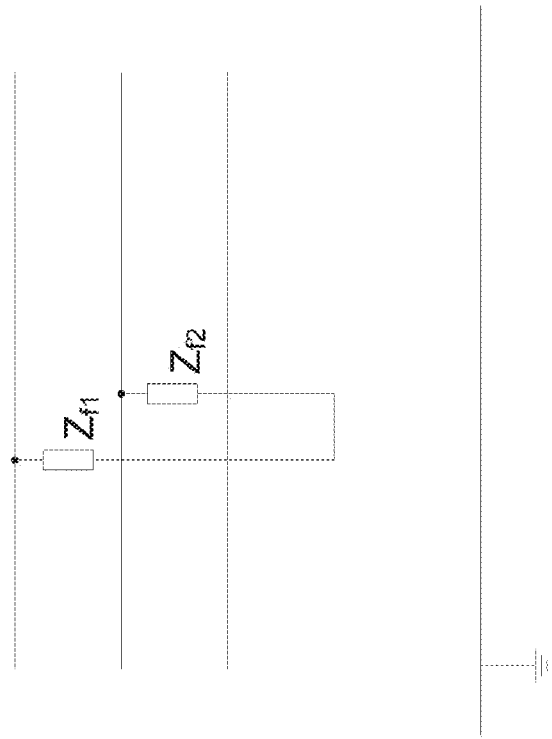
Figure 4C:
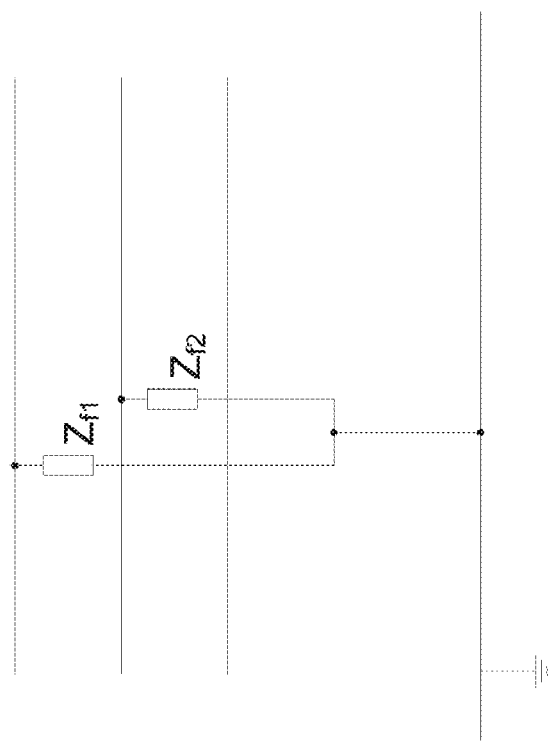

The fault analysis method implemented by the control system 104 can model various types of shunt faults for the individual phases of the buses 102 of the electric network. For example, FIGS. 4A through 4D illustrate various types of shunt faults which can occur on three-phase buses where $\tilde{Z}_{f1}, \tilde{Z}_{f2}, \tilde{Z}_{f3}$, and $\tilde{Z}_e$, represent the fault impedances. FIG. 4A shows a three-phase to ground short circuit, FIG. 4B shows a single line-to-ground fault, FIG. 4C shows a double line-to-ground fault, and FIG. 4D shows a line-to-line fault.

Figure 5:
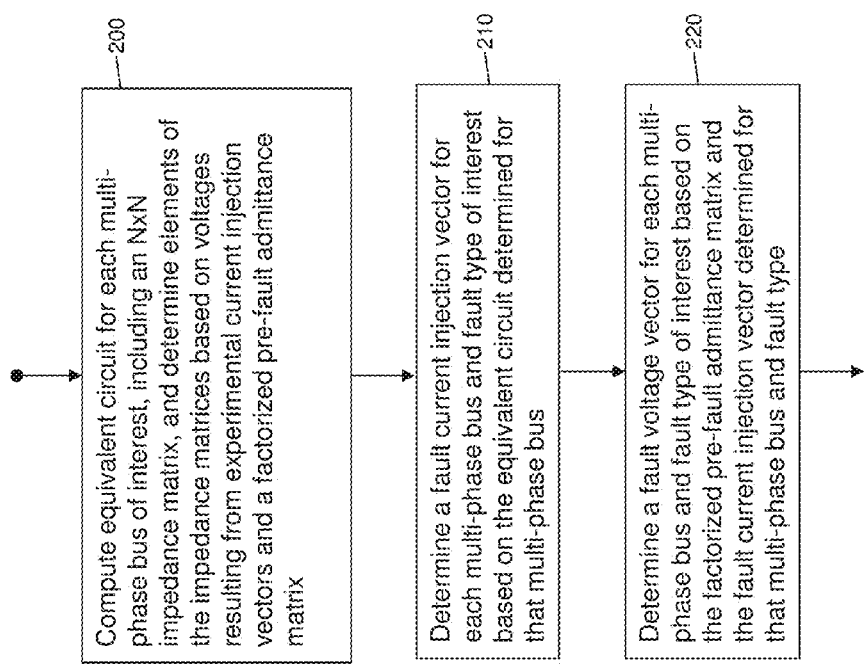
FIG. 5 illustrates a flow diagram of an embodiment of a method of fault analysis for an electric network including a plurality of multi-phase buses.

FIG. 5 illustrates an embodiment of fault analysis performed by the control system 104. The method includes computing equivalent circuits for the multi-phase buses 102 of interest, each equivalent circuit including an N×1 voltage source vector and an N×N impedance matrix $Z_{TE}$ where N corresponds to the number of phases of the multi-phase bus 102 for which that equivalent circuit is computed (Block 200). In one embodiment, the equivalent circuits are Thevenin equivalent circuits. With straightforward transformation, a multi-phase Norton equivalent can be constructed and used in the subsequent fault calculations based on the Norton equivalent circuit if so doing is expedient or otherwise more advantageous.

Figure 6:
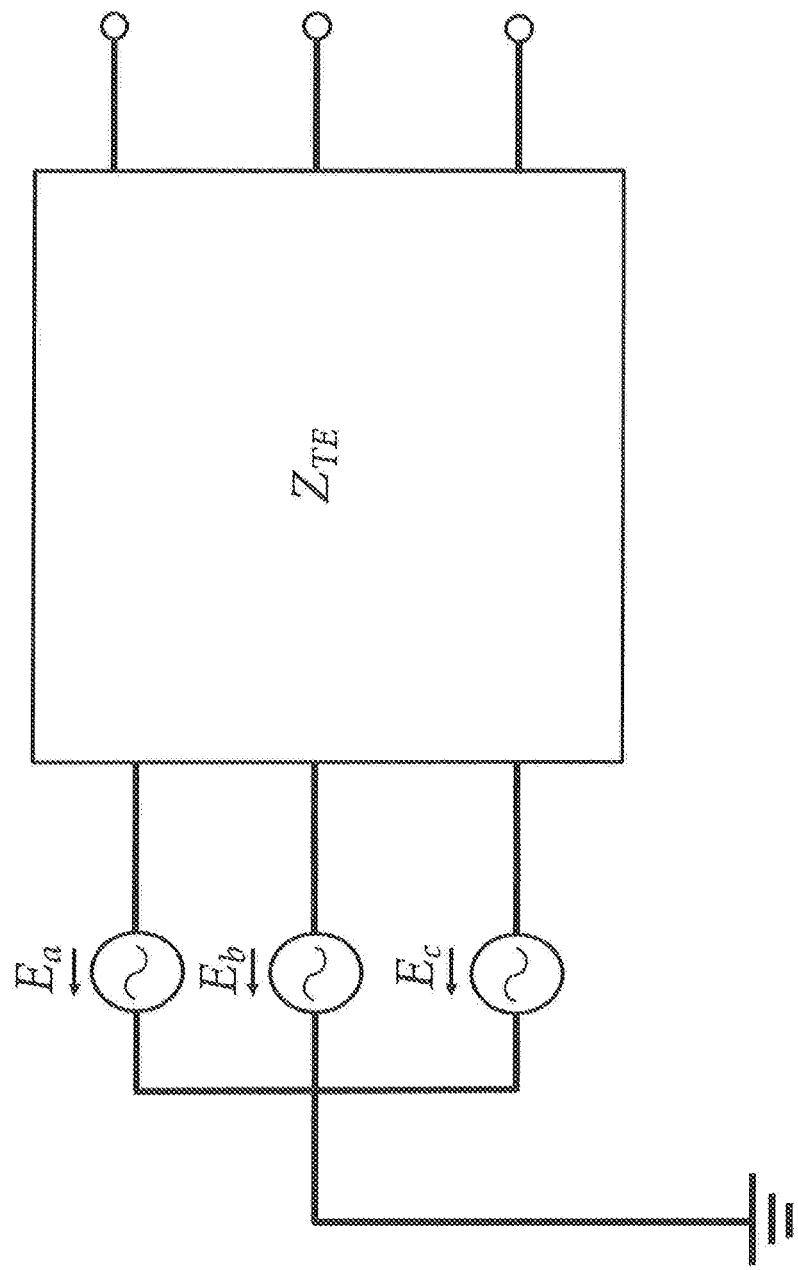
FIG. 6 illustrates a schematic diagram of a fault bus of interest modeled as a multi-phase Thevenin equivalent (TE) circuit.

FIG. 6 shows the system behavior characterized by a multi-phase Thevenin equivalent (TE) circuit at a fault bus of interest. The TE circuit is represented by a three-phase voltage source vector given by:

$$E = \begin{pmatrix} E_a \\ E_b \\ E_c \end{pmatrix} \quad (1)$$

and an N×N impedance matrix given by:

$$Z_{TE} = \begin{pmatrix} z_{aa} & z_{ab} & z_{ac} \\ z_{ba} & z_{bb} & z_{bc} \\ z_{ca} & z_{cb} & z_{cc} \end{pmatrix} \quad (2)$$

where N corresponds to the number of phases. Each diagonal element of $Z_{TE}$ represents a self-impedance and each off-diagonal element represents a phase-to-phase mutual impedance of the Thevenin equivalent for the fault bus of interest. For example, Zaa represents the self-impedance for phase a, Zbb represents the self-impedance for phase b, Zcc represents the self-impedance for phase c, Zab represents the mutual impedance between phases a and b, Zac represents the mutual impedance between phases a and c, etc. Vector E is the Thevinin equivalent voltage source, and is obtained from the pre-fault condition and does not change with fault locations.

Returning to FIG. 5, the fault analysis method further includes determining elements of the impedance matrix ($Z_{TE}$) for each fault bus 102 of interest based on voltages resulting from a plurality of experimental current injection vectors for that bus 102 and a factorized pre-fault admittance matrix $Y_{pre}$ (Block 200). These current injection vectors are experimental in that no actual current is injected into the electric network. Instead, these current injection vectors are hypothesized or simulated current injection vectors for modeling network behavior (as equivalent circuits) under certain nodal current conditions. An admittance matrix in power engineering is an N×N matrix describing a power system with n buses, and represents the nodal admittance of the buses without faults. In practical electric networks which contain many buses, the admittance matrix is quite sparse.

In more detail, $I_{pre}$ is a complex nodal source current vector and $V_{pre}$ denotes a complex pre-fault nodal voltage vector. The source current vector $I_{pre}$ represents the current source nodes of the electric network e.g. the substation nodes. The pre-fault complex admittance matrix $Y_{pre}$ can be calculated by the control system 104 using any suitable conventional technique, or provided to the control system 104 for use in implementing the fault analysis method. The computation of an admittance matrix for an electric network is known by those skilled in the power engineering arts, and therefore no further explanation is provided herein.

The pre-fault admittance matrix $Y_{pre}$ is either already available from another application or calculated once and reused by the control system 104 to perform fault analysis for the electric network. For notational convenience, all source nodes (e.g., the sub-station nodes) can be numbered first and in order of phase (a, b, etc.) for the same bus 102. For a network with only a single three-phase source, $I_{pre}$ and $V_{pre}$ are given by:

$$I_{pre} = [i_1, i_2, i_3, 0, 0, 0, \ldots, 0, 0]^T \quad (3)$$

$$V_{pre} = [v_1, v_2, v_3, v_4, v_5, \ldots, v_n]^T \quad (4)$$

which satisfy:

$$Y_{pre} V_{pre} = I_{pre} \quad (5)$$

$$E = \begin{pmatrix} E_a \\ E_b \\ E_c \end{pmatrix} \quad (5a)$$

and $$V_{pre} = [v_1, v_2, v_3, v_4, v_5, \ldots, v_n]^T \quad (5b)$$

The control system 104 can factorize the pre-fault admittance matrix $Y_{pre}$, or such factorization can already be complete. In one embodiment, an LU factorization of $Y_{pre}$ yields a lower triangular matrix L, an upper triangular matrix U, a permutation matrix P, and a column reordering matrix Q each factored from the pre-fault admittance matrix $Y_{pre}$. The first column of the impedance matrix $Z_{TE}$ can then be obtained for the fault bus 102 of interest in general by solving:

$$YV = I_a \quad (6)$$

and more specifically in one embodiment by solving:

$$V = [v_1, v_2, v_3, v_4, \ldots, v_a, v_b, v_c]^T = \text{Solve}(L, U, P, Q, I_a) \quad (7)$$

where Solve(L,U,P,Q,$I_a$) represents solving for a voltage vector V using the already factorized admittance matrix $Y_{pre}$ for a specified experimental current injection vector $I_a$. The voltage vector V is a function of the factorized components L, U, P, Q of the pre-fault admittance matrix $Y_{pre}$, and $I_a$ denotes the experimental current injection vector for the phase a node of the fault bus 102 under analysis.

For the first column of $Z_{TE}$, the experimental current injection vector $I_a$ has unit current injection at the phase a node of the fault bus 102 under analysis and zero injection at all other nodes as given by:

$$Ia = [0,0,0,0,0,0, \ldots, 0,0,1,0,0]^T \quad (8)$$

Using such an experimental current injection vector with unit current injection yields the following for the first column of $Z_{TE}$:

$$Z_{TE,a} = \begin{bmatrix} z_{aa} \\ z_{ba} \\ z_{ca} \end{bmatrix} = \begin{bmatrix} v_a \\ v_b \\ v_c \end{bmatrix} \quad (9)$$

The other two columns of $Z_{TE}$ for each fault bus 102 under analysis can be obtained in similar fashion with unit current injection at node b and node c, respectively, as given by:

$$I_b = [0, 0, 0, 0, 0, 0, \ldots, 0, 0, 0, 1, 0]^T \quad (10)$$

$$V = [v_1, v_2, v_3, v_4, \ldots, v_a, v_b, v_c]^T = \text{Solve}(L, U, P, Q, I_b) \quad (11)$$

$$Z_{TE,b} = \begin{bmatrix} z_{ab} \\ z_{bb} \\ z_{cb} \end{bmatrix} = \begin{bmatrix} v_a \\ v_b \\ v_c \end{bmatrix} \quad (12)$$

$$I_c = [0, 0, 0, 0, 0, 0, \ldots, 0, 0, 0, 0, 1]^T \quad (13)$$

$$V = [v_1, v_2, v_3, v_4, \ldots, v_a, v_b, v_c]^T = \text{Solve}(L, U, P, Q, I_c) \quad (14)$$

-continued $$Z_{TE,c} = \begin{bmatrix} z_{ac} \\ z_{bc} \\ z_{cc} \end{bmatrix} = \begin{bmatrix} v_a \\ v_b \\ v_c \end{bmatrix} \quad (15)$$

where Solve(L,U,P,Q,$I_x$) represents solving for a voltage vector V using the already factorized admittance matrix for a specified experimental current injection vector. The voltage vector V is a function of the factorized components L, U, P, Q of the pre-fault admittance matrix $Y_{pre}$, and $I_x$, which has unit current injection at the phase x node of the fault bus under analysis and zero injection at all other nodes. That is, the experimental current injection vector $I_x$ determined for each multi-phase bus 102 of interest has a unit value element corresponding to each phase of that bus 102 and zero value elements elsewhere.

Again returning to FIG. 5, once the equivalent circuit ($Z_{TE}$) is obtained for the multi-phase buses 102 of interest, a fault current injection vector $I_f$ can be determined for each multi-phase bus 102 and fault type of interest based on the equivalent circuit determined for that multi-phase bus 102 (Block 210). The fault current for the different fault types of interest can be calculated using any known method. For many of the fault types, an analytic expression can be readily derived. Further details of the calculation procedure for the node fault currents is omitted here because many approaches can be used, each of which is well known to those with a basic engineering background and given the equivalent circuits previously determined. The fault currents calculated based on the equivalent circuits can be represented in a 3×1 vector as given by:

$$I_{f,eq.} = \begin{bmatrix} I_{f,eq.-a} \\ I_{f,eq.-b} \\ I_{f,eq.-c} \end{bmatrix} \quad (16)$$

The fault current vector from equation (16) is used construct a post-fault current injection vector $I_f$ applied to the pre-fault admittance matrix. $I_f$ is calculated for each multi-phase bus 102 and fault type of interest and is the sum of the post-fault current vector (expanded to the right dimension) $I_{f,eq}$ represented by equation (16) and the pre-fault source current injection vector $I_{pre}$ represented by equation (3), as given by:

$$I_f = [i_1, i_2, i_3, 0, 0, 0, \ldots, 0, 0]^T + [0, 0, 0, \ldots, 0, 0, I_{f,eq.-a}, I_{f,eq.-b}, I_{f,eq.-c}]^T \quad (17)$$

The fault current injection vector $I_f$ determined for each multi-phase bus 102 and fault type of interest has non-zero value elements corresponding to the source buses in the pre-fault condition and to the phases of that fault bus and zero value elements elsewhere.

The fault analysis method continues with the control system 104 determining a fault voltage vector $V_f$ for each multi-phase bus 102 and fault type of interest, based on the fault current injection vector $I_f$ determined for that multi-phase bus 102 and fault type and the factorized pre-fault admittance matrix $Y_{pre}$ (Block 220). The fault voltage vector $V_f$ for each multi-phase bus 102 and fault type of interest can be determined as given by:

$$V_f = [v_1, v_2, v_3, v_4, v_5, \ldots, v_n]^T = \text{Solve}(L, U, P, Q, I_f) \quad (18)$$

where Solve(L,U,P,Q,$I_f$) represents solving for $V_f$ as a function of the factorized components L, U, P, Q of the pre-fault admittance matrix $Y_{pre}$, and the fault current injection vector $I_f$ determined for the fault node bus 102 under analysis.

With the post-fault voltages known at all buses 102 of interest, the fault current on any branch of interest within the electric network can be calculated using the fundamental equations for the branch. Fault location analysis can be performed by the control system 104 based on pattern matching between measured fault current and the calculated fault current at a hypothesized fault location and for different fault types. In one embodiment, one or more fault currents are measured in the electric network and reported to the control system 104 via the I/O circuitry 114. The processing circuit 106 compares the one or more measured fault currents with the calculated fault currents determined by the fault analyzer 108 to identify one or more likely fault conditions in the electric network. Such an approach is particularly advantageous in online applications where speed is important.

Figure 7:
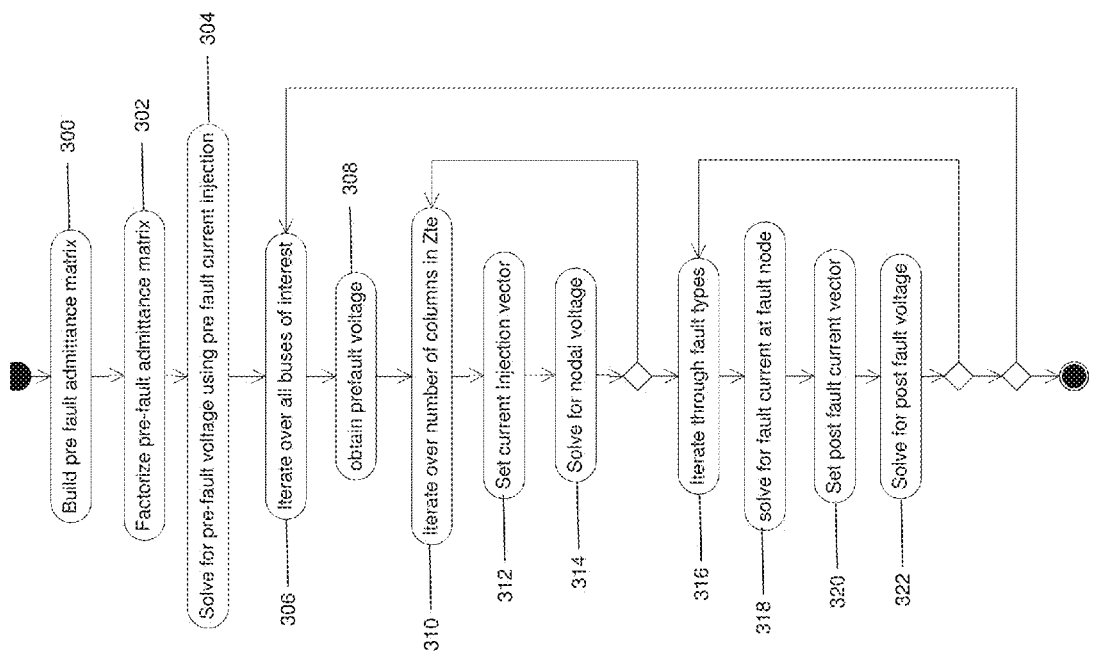
FIG. 7 illustrates a flow diagram of another embodiment of a method of fault analysis for an electric network including a plurality of multi-phase buses.

FIG. 7 illustrates a more detailed flow chart of the fault analysis method described herein. The pre-fault admittance matrix $Y_{pre}$ is computed or ascertained at Block 300 and factorized at Block 302. The pre-fault voltage vector $V_{pre}$ is calculated based on the pre-fault source current vector $I_{pre}$ and the pre-fault admittance matrix $Y_{pre}$ at Block 304 in accordance with equation (5). The control system 104 then iterates the fault analysis procedure over all buses 102 of interest (Block 306). Iteration over all buses of interest involves calculating a pre-fault voltage for each bus 102 of interest in accordance with equations (6) and (7) at Block 308, and then iterating over all columns of the impedance matrix $Z_{TE}$ for each fault bus 102 of interest (Block 310). Iterating over all columns of the impedance matrix $Z_{TE}$ for each fault bus 102 of interest includes setting a current injection vector $I_x$ for each phase node of the fault bus 102 under analysis at Block 312 in accordance with equation (8), and solving for the corresponding nodal voltages at Block 314 in accordance with equation (8). At this point, equivalent circuits (E, $Z_{TE}$) are obtained for the multi-phase buses 102 of interest.

The fault analysis process then iterates through all fault types of interest to complete the process (Block 316). Iterating through all fault types of interest includes solving for the fault currents at each fault node (Block 318) in accordance with equation (16), setting the post-fault current injection vector $I_f$ (Block 320) in accordance with equation (17) and solving for the corresponding post-fault voltages (Block 322) in accordance with equation (18). With the post-fault voltages known at all buses 102 of interest, the fault current on any branch of interest within the electric network can be calculated using fundamental equations of the branch.

Terms such as "first", "second", and the like, are used to describe various elements, regions, sections, etc. and are not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of fault analysis for an electric power transmission or distribution system having a plurality of multi-phase buses, wherein a control system is in communication with the electric power transmission or distribution system, the control system including a processing circuit having a processor, the processing circuit being configured to monitor and control an operation of the electric power transmission or distribution system, the processing circuit configured to perform the following steps of the method:

computing equivalent circuits for the multi-phase buses of interest, each equivalent circuit including an N×N impedance matrix where N corresponds to the number of phases of the multi-phase bus for which that equivalent circuit is computed;

determining elements of the impedance matrices based on voltages resulting from a plurality of experimental current injection vectors and a factorized pre-fault admittance matrix, the pre-fault admittance matrix representing nodal admittance of the multi-phase buses without faults;

determining a fault current injection vector for each multi-phase bus and fault type of interest based on the equivalent circuit determined for that multi-phase bus;

determining a fault voltage vector for each multi-phase bus and fault type of interest based on the factorized pre-fault admittance matrix and the fault current injection vector determined for that multi-phase bus and fault type; and outputting a signal based on the determined fault voltage vector, the signal controlling transmission of the electric power transmission or distribution system.

2. The method according to claim 1, wherein the equivalent circuits are Thevenin equivalent circuits, each Thevenin equivalent circuit further including an N×1 voltage source vector having elements determined as pre-fault voltages at the corresponding bus under analysis.

3. The method according to claim 1, wherein the experimental current injection vectors determined for each multi-phase bus of interest have a unit value element corresponding to each phase of that bus and zero value elements elsewhere.

4. The method according to claim 3, wherein determining the elements of the impedance matrices comprises, for each impedance matrix, solving the elements of the impedance matrix as a function of a lower triangular matrix factored from the pre-fault admittance matrix, an upper triangular matrix factored from the pre-fault admittance matrix, a permutation matrix factored from the pre-fault admittance matrix, a column reordering matrix factored from the pre-fault admittance matrix, and the experimental current injection vectors determined for the multi-phase bus for which the impedance matrix is computed.

5. The method according to claim 1, wherein the fault current injection vectors determined for each multi-phase bus and fault type of interest has non-zero value elements corresponding to the phases of that bus and zero value elements elsewhere.

6. The method according to claim 5, wherein determining the fault voltage vector for each multi-phase bus and fault type of interest comprises, for each multi-phase bus and fault type of interest, solving each element of the fault voltage vector as a function of a lower triangular matrix factored from the pre-fault admittance matrix, an upper triangular matrix factored from the pre-fault admittance matrix, a permutation matrix factored from the pre-fault admittance matrix, a column reordering matrix factored from the pre-fault admittance matrix, and the fault current injection vector determined for that multi-phase bus and fault type.

7. The method according to claim 1, wherein determining the fault current injection vector for each multi-phase bus and fault type of interest comprises:

calculating a post-fault current vector for each multi-phase bus and fault type of interest based on the equivalent circuit determined for that multi-phase bus; and adding each post-fault current vector to a complex source current vector representing current source nodes of the electric power transmission or distribution system to determine the fault current vector for each multi-phase bus and fault type of interest.

8. The method according to claim 1, further comprising calculating a fault current on each multi-phase bus of interest based on the pre-fault admittance matrix and the fault voltage vector determined for that multi-phase bus.

9. The method according to claim 8, further comprising:

measuring one or more fault currents in the electric power transmission or distribution system and comparing the one or more measured fault currents with the calculated fault currents to identify the one or more likely fault conditions in the electric power transmission or distribution system.

10. A system for performing fault analysis for an electric power transmission or distribution system having a plurality of multi-phase buses, the system comprising:

a control system in communication with the electric power transmission or distribution system and configured to monitor and control an operation of the electric power transmission or distribution system, the control system having a processing circuit having a processor, the processing circuit configured to execute instructions to perform a method, the instructions comprising instructions to:

compute equivalent circuits for the multi-phase buses of interest, each equivalent circuit including an N×N impedance matrix where N corresponds to the number of phases of the multi-phase bus for which that equivalent circuit is computed;

determine elements of the voltage source vector as pre-fault voltages at each bus under fault analysis;

determine elements of the impedance matrices based on voltages resulting from a plurality of experimental current injection vectors and a factorized pre-fault admittance matrix, the pre-fault admittance matrix representing nodal admittance of the multi-phase buses without faults;

determine a fault current injection vector for each multi-phase bus and fault type of interest based on the equivalent circuit determined for that multi-phase bus;

determine a fault voltage vector for each multi-phase bus and fault type of interest based on the factorized pre-fault admittance matrix and the fault current injection vector determined for that multi-phase bus and fault type; and output a signal based on the determined fault voltage vector and control transmission of the electric power transmission or distribution system.

11. The system according to claim 10, further comprising program instructions to calculate a fault current on each multi-phase bus of interest based on the pre-fault admittance matrix and the fault voltage vector determined for that multi-phase bus, and compare one or more measured fault currents in the electric power transmission or distribution system with the calculated fault currents to identify the one or more likely fault conditions in the electric power transmission or distribution system.

12. A computer system in communication with an electric power transmission or distribution system having a plurality of multi-phase buses, the computer system comprising a processing circuit having a processor configured to monitor and control an operation of the electric power transmission or distribution system, the processing circuit operable to:
receive measured data from the electric power transmission or distribution system;
compute equivalent circuits for the multi-phase buses of interest, each equivalent circuit including an N×N impedance matrix where N corresponds to the number of phases of the multi-phase bus for which that equivalent circuit is computed;
determine elements of the impedance matrices based on voltages resulting from a plurality of experimental current injection vectors and a factorized pre-fault admittance matrix, the pre-fault admittance matrix representing nodal admittance of the multi-phase buses without faults;
determine a fault current injection vector for each multi-phase bus and fault type of interest based on the equivalent circuit determined for that multi-phase bus;
determine a fault voltage vector for each multi-phase bus and fault type of interest based on the factorized pre-fault admittance matrix and the fault current injection vector determined for that multi-phase bus and fault type; and
output a signal based on the determined fault voltage vector and control transmission of the electric power transmission or distribution system.

13. The computer system according to claim 12, wherein the processing circuit is operable to model the multi-phase buses of interest as Thevenin equivalent circuits, each Thevenin equivalent circuit further including an N×1 voltage source vector having elements determined by the processing circuit as pre-fault voltages at the corresponding bus under analysis.

14. The computer system according to claim 12, wherein the processing circuit is operable to determine the experimental current injection vectors for each multi-phase bus of interest as a unit value element corresponding to each phase of that bus and zero value elements elsewhere.

15. The computer system according to claim 14, wherein for each impedance matrix, the processing circuit is operable to solve each element of the impedance matrix as a function of a lower triangular matrix factored from the pre-fault admittance matrix, an upper triangular matrix factored from the pre-fault admittance matrix, a permutation matrix factored from the pre-fault admittance matrix, a column reordering matrix factored from the pre-fault admittance matrix, and the experimental current injection vectors determined for the multi-phase bus for which the impedance matrix is computed.

16. The computer system according to claim 12, wherein the processing circuit is operable to determine the fault current injection vector for each multi-phase bus and fault type of interest as non-zero value elements corresponding to the phases of that bus and zero value elements elsewhere.

17. The computer system according to claim 16, wherein for each multi-phase bus and fault type of interest, the processing circuit is operable to solve each element of the fault voltage vector as a function of a lower triangular matrix factored from the pre-fault admittance matrix, an upper triangular matrix factored from the pre-fault admittance matrix, a permutation matrix factored from the pre-fault admittance matrix, a column reordering matrix factored from the pre-fault admittance matrix, and the fault current injection vector determined for that multi-phase bus and fault type.

18. The computer system according to claim 12, wherein the processing circuit is operable to calculate a post-fault current vector for each multi-phase bus and fault type of interest based on the equivalent circuit determined for that multi-phase bus, and add each post-fault current vector to a complex source current vector representing current source nodes of the electric power transmission or distribution system to determine the fault current vector for each multi-phase bus and fault type of interest.

19. The computer system according to claim 12, wherein the processing circuit is further operable to calculate a fault current on each multi-phase bus of interest based on the pre-fault admittance matrix and the fault voltage vector determined for that multi-phase bus.

20. The computer system according to claim 19, wherein the processing circuit is further operable to compare one or more measured fault currents in the electric power transmission or distribution system with the calculated fault currents to identify the one or more likely fault conditions in the electric power transmission or distribution system.

* * * * *